United States Patent
Choi et al.

(10) Patent No.: US 9,520,422 B2
(45) Date of Patent: Dec. 13, 2016

(54) OXIDE THIN FILM TRANSISTOR AND MANUFACTURING METHOD THEREOF, ARRAY SUBSTRATE AND DISPLAY DEVICE

(71) Applicant: BOE TECHNOLOGY GROUP CO., LTD., Beijing (CN)

(72) Inventors: Hyun Sic Choi, Beijing (CN); Yun Sik Im, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/652,639

(22) PCT Filed: Nov. 3, 2014

(86) PCT No.: PCT/CN2014/090154
§ 371 (c)(1),
(2) Date: Jun. 16, 2015

(87) PCT Pub. No.: WO2015/067148
PCT Pub. Date: May 14, 2015

(65) Prior Publication Data
US 2015/0340504 A1    Nov. 26, 2015

(30) Foreign Application Priority Data
Nov. 5, 2013    (CN) .......................... 2013 1 0542201

(51) Int. Cl.
*H01L 29/10* (2006.01)
*H01L 27/12* (2006.01)
(Continued)

(52) U.S. Cl.
CPC ......... *H01L 27/1288* (2013.01); *H01L 21/441* (2013.01); *H01L 21/467* (2013.01);
(Continued)

(58) Field of Classification Search
CPC ........... H01L 27/1288; H01L 29/41733; H01L 29/66969; H01L 29/7869; H01L 29/78696
(Continued)

(56) References Cited

U.S. PATENT DOCUMENTS 7,332,432 B2 * 2/2008 Nakamura ............ H01L 21/288
257/E21.174
7,981,720 B2 * 7/2011 Kim .................. H01L 21/02554
438/104
(Continued)

FOREIGN PATENT DOCUMENTS

CN    101621038 A    1/2010
CN    102479752 A    5/2012
(Continued)

OTHER PUBLICATIONS

International Search Report mailed Feb. 17, 2015; PCT/CN2014/090154.
(Continued)

*Primary Examiner* — Jay C Kim
(74) *Attorney, Agent, or Firm* — Ladas & Parry LLP

(57) ABSTRACT

An oxide thin film transistor and a manufacturing method thereof, an array substrate and a display device are provided. The method comprises: forming a gate electrode (1), a gate insulating layer (4) and an oxide semiconductor thin film (10) sequentially on a substrate; forming a first photoresist (11*a*) above an active layer region of the oxide semiconductor thin film (10), such that a thickness of the first photoresist above a channel region is greater than a thickness of the first photoresist above a non-channel region; reserving the first photoresist (11*a*) above the channel region; forming a source-drain metal thin film and a second photoresist (11*b*) sequentially on a pattern of an active layer, removing a portion of the source-drain metal thin film and a portion of the second photoresist (11*b*), such that an edge (Continued)

of the first photoresist (11a) above the channel region is covered with the source-drain metal thin film; and obtaining patterns of a source electrode and a drain electrode. Upon preliminary patterns of the source electrode and the drain electrode are formed, the photoresist instead of a protective layer is used to protect the active layer, therefore shortening a length of a channel of the oxide thin film transistor.

9 Claims, 4 Drawing Sheets

(51) Int. Cl.
    *H01L 29/786* (2006.01)
    *H01L 21/441* (2006.01)
    *H01L 21/467* (2006.01)
    *H01L 29/417* (2006.01)
    *H01L 29/66* (2006.01)

(52) U.S. Cl.
    CPC .. *H01L 29/41733* (2013.01); *H01L 29/66969* (2013.01); *H01L 29/7869* (2013.01); *H01L 29/78696* (2013.01)

(58) Field of Classification Search
    USPC .......................................................... 257/43
    See application file for complete search history.

(56) References Cited

U.S. PATENT DOCUMENTS

| | | | | |
|---|---|---|---|---|
| 8,062,936 | B2* | 11/2011 | Seo | G02F 1/136227 |
| | | | | 257/E21.372 |
| 8,263,977 | B2* | 9/2012 | Inoue | H01L 29/7869 |
| | | | | 257/382 |
| 8,558,984 | B2* | 10/2013 | Lee | G02F 1/1368 |
| | | | | 349/187 |
| 8,723,170 | B2* | 5/2014 | Im | H01L 29/42384 |
| | | | | 257/40 |
| 8,723,179 | B2* | 5/2014 | Yun | H01L 27/1214 |
| | | | | 257/59 |
| 8,822,995 | B2* | 9/2014 | You | H01L 27/1214 |
| | | | | 257/295 |
| 8,836,877 | B2* | 9/2014 | Choi | H01L 27/1225 |
| | | | | 257/59 |
| 8,877,551 | B2* | 11/2014 | Kim | H01L 29/66969 |
| | | | | 438/104 |
| 8,946,005 | B2* | 2/2015 | Lee | H01L 27/1214 |
| | | | | 257/59 |
| 2002/0153566 | A1 | 10/2002 | Hwang | |
| 2004/0180480 | A1* | 9/2004 | Dejima | H01L 27/1214 |
| | | | | 438/161 |
| 2005/0074914 | A1* | 4/2005 | Chang | H01L 27/1214 |
| | | | | 438/48 |
| 2012/0184060 | A1* | 7/2012 | Song | H01L 27/1214 |
| | | | | 438/34 |
| 2015/0340504 | A1 | 11/2015 | Choi et al. | |

FOREIGN PATENT DOCUMENTS

| | | |
|---|---|---|
| CN | 102709326 A | 10/2012 |
| CN | 102709327 A | 10/2012 |
| CN | 103337462 A | 10/2013 |
| CN | 103545378 A | 1/2014 |
| JP | 2007-206134 A | 8/2007 |

OTHER PUBLICATIONS

Written Opinion of the International Searching Authority mailed Feb. 17, 2015; PCT/CN2014/090154.
First Chinese Office Action Appln. No. 201310542201.X; Dated Aug. 31, 2015.
Second Chinese Office Action Appln. No. 201310542201.X; Dated Mar. 1, 2016.
Third Chinese Office Action dated May 3, 2016; Appln. No. 201310542201.X.

* cited by examiner

OXIDE THIN FILM TRANSISTOR AND MANUFACTURING METHOD THEREOF, ARRAY SUBSTRATE AND DISPLAY DEVICE

TECHNICAL FIELD

Embodiments of the invention relate to an oxide thin film transistor and manufacturing method thereof, an array substrate and a display device.

BACKGROUND

In the liquid crystal display technology, the Advanced Super Dimension Switch (ADS) technology mode gradually replaces the Twisted Nematic (TN) liquid crystal model due to the advantages, such as high transmittance, wide viewing angle, fast response speed and low power consumption, and becomes one of key technologies in the field of liquid crystal display.

In the ADS mode, an oxide thin film transistor has a protective layer 13 formed on an indium gallium zinc oxide (IGZO) layer where a channel is formed. FIG. 1 and FIG. 2 are a cross-sectional view and a top view of an oxide thin film transistor, respectively. In the oxide thin film transistor, the IGZO layer is connected with a source electrode 2 and a drain electrode 3 through via holes. Upon the via holes are formed, in order to prevent the source electrode 2 and the drain electrode 3 from short-circuiting, a certain interval is kept between the source electrode 2 and the drain electrode 3. An active layer in the interval is a channel 12 of the oxide thin film transistor, as indicated by L in FIG. 2. In the structure of the oxide thin film transistor, the length of the channel is generally within 9.5~10 μm.

SUMMARY

Embodiments of the invention relate to an oxide thin film transistor and manufacturing method thereof, an array substrate and a display device to reduce the length of a channel of the oxide thin film transistor.

At least one embodiment of the invention provides a manufacturing method of oxide thin film transistor. The method comprises: forming a gate electrode and a gate insulating layer sequentially on a substrate; forming an oxide semiconductor thin film on the gate insulating layer, and forming a first photoresist above an active layer region of the oxide semiconductor thin film, such that a thickness of the first photoresist above a channel region is greater than a thickness of the first photoresist above a non-channel region; removing the oxide semiconductor thin film of an non-active layer region to form a pattern of an active layer, removing the first photoresist above the non-channel region, and reserving the first photoresist above the channel region; forming a source-drain metal thin film and a second photoresist sequentially on the pattern of the active layer, removing a portion of partial source-drain metal thin film corresponding to the first photoresist above the channel region and a portion of partial second photoresist corresponding to the first photoresist above the channel region, such that an edge of the first photoresist above the channel region is covered by the source-drain metal thin film; lifting off the remaining second photoresist, the source-drain metal thin film covering the edge of the first photoresist above the channel region, and the first photoresist above the channel region to form patterns of a source electrode and a drain electrode.

In one embodiment of the invention, the step of forming the oxide semiconductor thin film on the gate insulating layer, and forming the first photoresist above the active layer region of the oxide semiconductor thin film, such that the thickness of first photoresist above a channel region is greater than the thickness of first photoresist above the non-channel region, comprises:

forming a first photoresist on the oxide semiconductor thin film; fully exposing and developing the first photoresist above the non-active layer region, partially exposing and developing the first photoresist above the non-channel region of the active layer region, and not exposing and developing the first photoresist above the channel region by means of a half-tone mask to form a photoresist of the active layer region.

In one embodiment of the invention, the step of removing the oxide semiconductor thin film of the non-active layer region to form the pattern of the active layer, removing the first photoresist above the non-channel region, and reserving the first photoresist above the channel region, comprises:

removing the oxide semiconductor thin film of the non-active layer region by a patterning process to obtain the pattern of the active layer;

removing the first photoresist above the non-channel region by an ashing process to reserve the first photoresist above the channel region.

In one embodiment of the invention, a length of a channel in the oxide thin film transistor is, for example, in a range of 5 μm to 7 μm.

In one embodiment of the invention, the length of the channel in the oxide thin film transistor is, for example, in a range of 5 μm to 6 μm.

Another embodiment of the invention further provides an oxide thin film transistor comprising: a gate electrode, a gate insulating layer formed on one side of the gate electrode, an active layer forming on one side of the gate insulating layer away from the gate electrode, and a source electrode and a drain electrode formed on one side of the active layer away from the gate insulating layer. The source electrode and the drain electrode are both directly connected with the active layer, and the active layer is made of an oxide semiconductor material.

In one embodiment of the invention, a length of a channel between the source electrode and the drain electrode is, for example, in a range of 5 μm to 7 μm.

In one embodiment of the invention, the length of the channel between the source electrode and the drain electrode is, for example, in a range of 5 μm to 6 μm.

Another embodiment of the invention further provides an array substrate comprising the oxide thin film transistor in accordance with any embodiments as mentioned above.

In one embodiment of the invention, the array substrate further comprises: a resin layer and a passivation layer, wherein, the resin layer covers the source electrode, the drain electrode and the channel between the source electrode and the drain electrode, and the passivation layer is located on one side of the resin layer away from the source electrode and the drain electrode.

Still another embodiment of the invention further provides a display device comprising the array substrate in accordance with any embodiments as mentioned above.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

Figure 1:
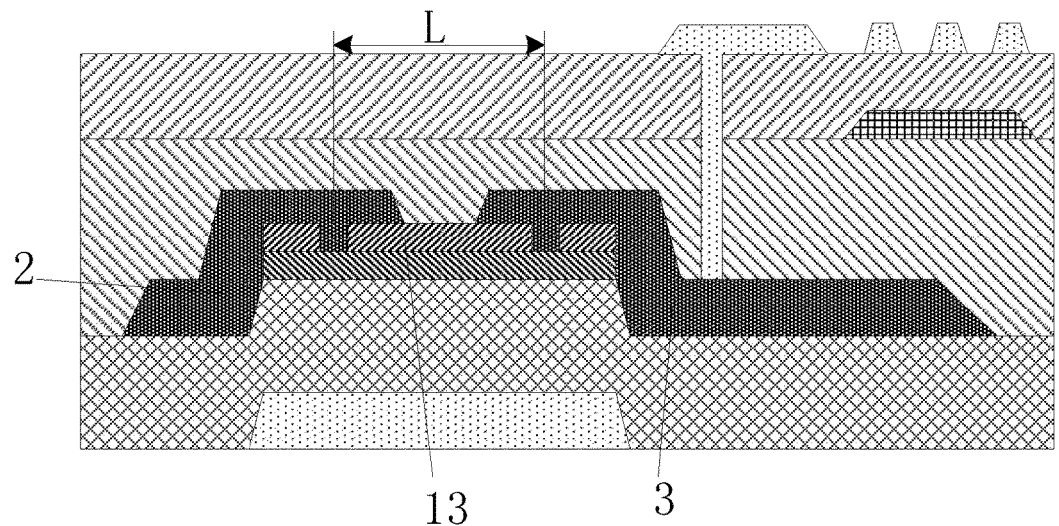
FIG. 1 is a cross-sectional view of an oxide thin film transistor.

In order to make objects, technical solutions and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain all other embodiment(s), without any inventive work, which should be within the scope of the invention.

The inventor noticed that the length of the channel of the oxide thin film transistor is relatively long, and thus it is hard to apply the oxide thin film transistor to ultra-high-definition products such as 400PPI~500PPI, and pixel structures with a pixel pitch of 21 μm or less.

First Embodiment

One embodiment of the invention provides a manufacturing method of oxide thin film transistor, comprising:

forming a gate electrode and a gate insulating layer sequentially on a substrate;

forming an oxide semiconductor thin film on the gate insulating layer, and forming a first photoresist above an active layer region of the oxide semiconductor thin film, such that a thickness of the first photoresist above a channel region is greater than a thickness of the first photoresist above a non-channel region;

removing the oxide semiconductor thin film of an non-active layer region to form a pattern of an active layer, removing the first photoresist above the non-channel region, and reserving the first photoresist above the channel region;

forming a source-drain metal thin film and a second photoresist sequentially on the pattern of the active layer, removing a portion of partial source-drain metal thin film corresponding to the first photoresist above the channel region and a portion of partial second photoresist corresponding to the first photoresist above the channel region, such that an edge of the first photoresist above the channel region is covered by the source-drain metal thin film;

lifting off the remaining second photoresist, the source-drain metal thin film covering the edge of the first photoresist above the channel region, and the first photoresist above the channel region to form patterns of a source electrode and a drain electrode.

In the manufacturing method of oxide thin film transistor provided by the embodiment of the invention, a photoresist instead of a protective layer is used to protect the active layer, so that upon the source electrode and the drain electrode are formed above the active layer, the source electrode and the drain electrode are directly connected with the active layer, and is not required to be connected with the active layer through via holes. Final patterns of the source electrode and the drain electrode are formed by photoresist lifting-off process, so as to shorten the length of the channel of the oxide thin film transistor.

"Partial source-drain metal thin film corresponding to the first photoresist above the channel region" described in the embodiment of the invention refers to the partial source-drain metal thin film opposed to the first photoresist above the channel region, for example, can be the partial source-drain metal thin film located right above the first photoresist above the channel region.

As illustrated in FIGS. 5a~5d, a specific process flow of a manufacturing method of oxide thin film transistor provided by one embodiment of the invention comprises steps as follows.

Figure 5A:
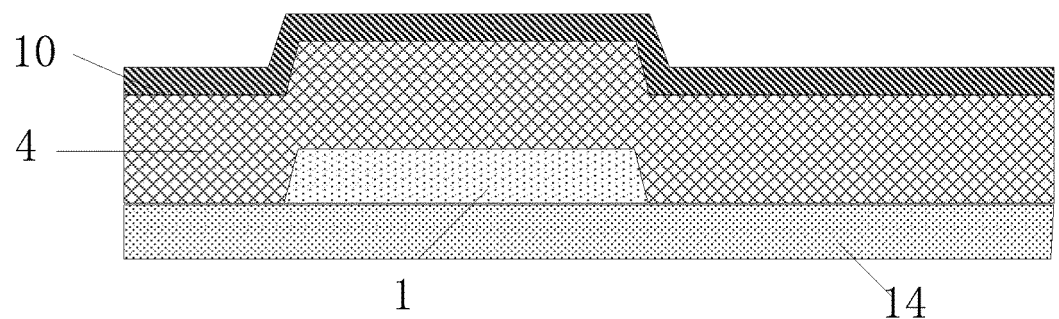
FIG. 5a to FIG. 5d are process flow diagrams of a manufacturing method of oxide thin film transistor provided by an embodiment of the invention.

A gate electrode 1 and a gate insulating layer 4 are sequentially formed on a substrate 14 by a patterning process, and an oxide semiconductor thin film 10 is formed on the gate insulating layer 4. The oxide semiconductor thin film 10 is a thin film composed of oxygen and at least two elements of Indium (In), Gallium (Ga), Zinc (Zn), Stannum (Sn), etc. For example, the oxide semiconductor thin film can be an indium gallium zinc oxide (IGZO) thin film, an indium zinc oxide (IZO) thin film, an indium stannum oxide (InSnO) thin film or an indium gallium stannum oxide (InGaSnO) thin film, etc. Referring to FIG. 5a, the patterning process used in this step is a known scheme which will not be repeated here.

A first photoresist 11a is formed on the oxide semiconductor thin film 10 by a photoresist process, and the first photoresist 11a is exposed and developed by means of a half-tone mask.

Figure 5B:
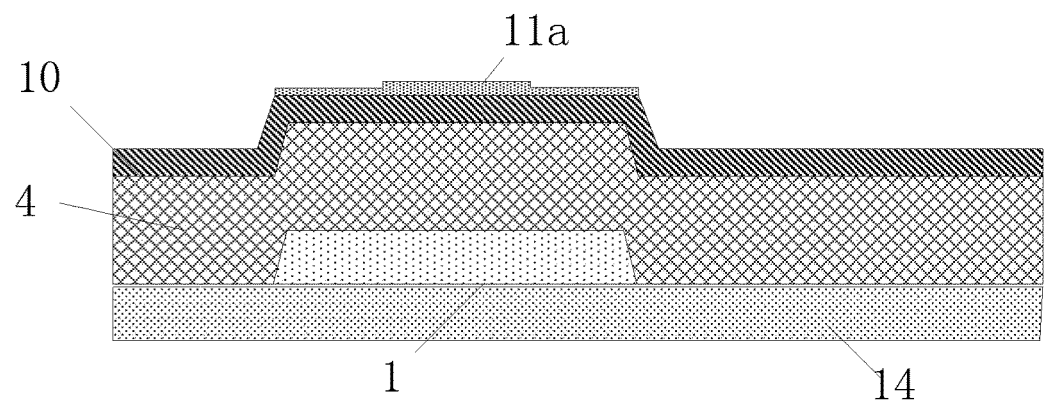

Referring to FIG. 5a and FIG. 5b, by taking the first photoresist being a positive photoresist as an example, a portion of the half-tone mask corresponding to a non-active layer region is fully transparent, a portion of the half-tone mask corresponding to a non-channel region in an active layer region is semi-transparent, and a portion of the half-tone mask corresponding to a channel region is opaque. After the first photoresist 11a is exposed and developed by means of the half-tone mask, the first photoresist 11a above the active layer region in FIG. 5b is obtained. In the first photoresist 11a above the active layer region, a thickness of the first photoresist 11a above the channel region is greater than a thickness of the first photoresist 11a above the non-channel region.

The oxide semiconductor thin film 10 is etched to obtain an active layer 5, and the first photoresist 11a above the active layer region is treated by an ashing process, and the first photoresist 11a above the channel region is reserved.

In the process that the oxide semiconductor thin film 10 is etched, the first photoresist layer 11a above the active layer region plays a role of protecting the active layer 5.

Figure 5C:
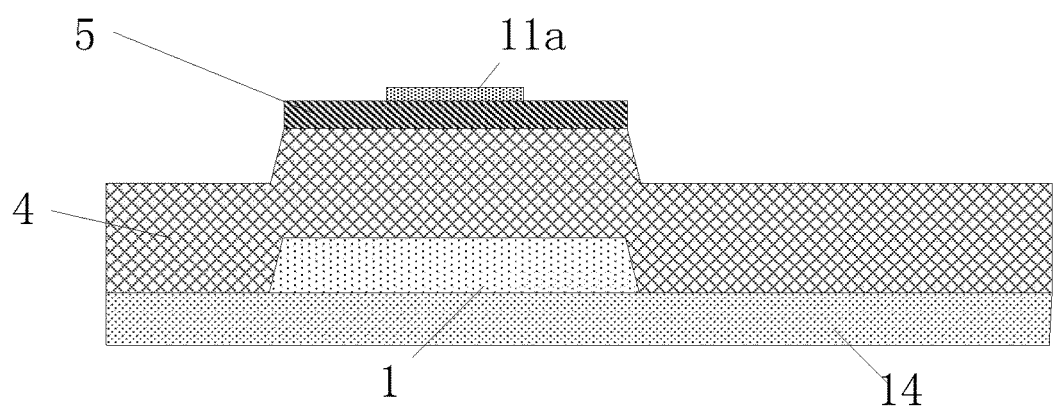

The etching treatment is performed in the non-active layer region of the oxide semiconductor thin film layer 10 to obtain the active layer 5 as illustrated in FIG. 5c. After the performance of the etching treatment in the non-active layer region of the oxide semiconductor thin film 10, the first photoresist 11a above the active layer region is treated by the ashing process to obtain the first photoresist 11a above the channel region as illustrated in FIG. 5c, then, a length of the photoresist above the channel region is just a length of a channel 12 of the oxide thin film transistor.

After the photoresist above the active layer region is treated by the ashing process, a thickness of the photoresist above the active layer region is less than that of the photoresist above the active layer region before the aching process.

A source-drain metal thin film is formed above the active layer 5, and the first photoresist 11a above the channel region is fully covered by the source-drain metal thin film.

A second photoresist 11b is formed above the source-drain metal thin film.

A portion of partial source-drain metal thin film corresponding to the first photoresist 11a above the channel region and a portion of partial second photoresist 11b corresponding to the first photoresist 11a above the channel region are removed, such that an edge of the first photoresist 11a above the channel region is covered by the source-drain metal thin film.

Figure 5D:
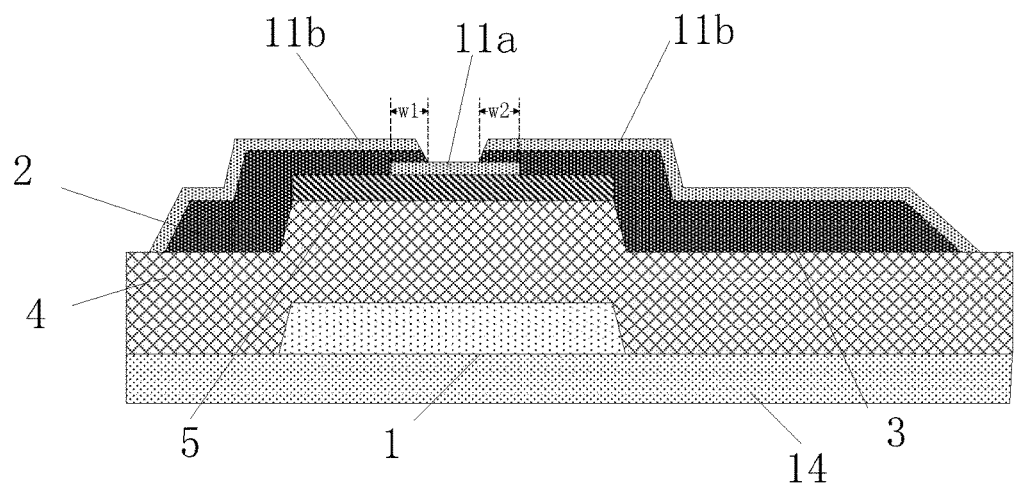

As illustrated in FIG. 5d, the active layer region between the source electrode 2 and the drain electrode 3 is the channel 12 of the oxide thin film transistor. With the current allowable accuracy, for example, a distance between the source electrode 2 and the drain electrode 3 is 3 μm, and a width w1 of the source electrode 2 located above the first photoresist 11a is in a range of 1 μm to 1.5 μm, and a width w2 of the drain electrode 3 located above the first photoresist 11a is in a range of 1 μm to 1.5 μm.

Figure 5E:
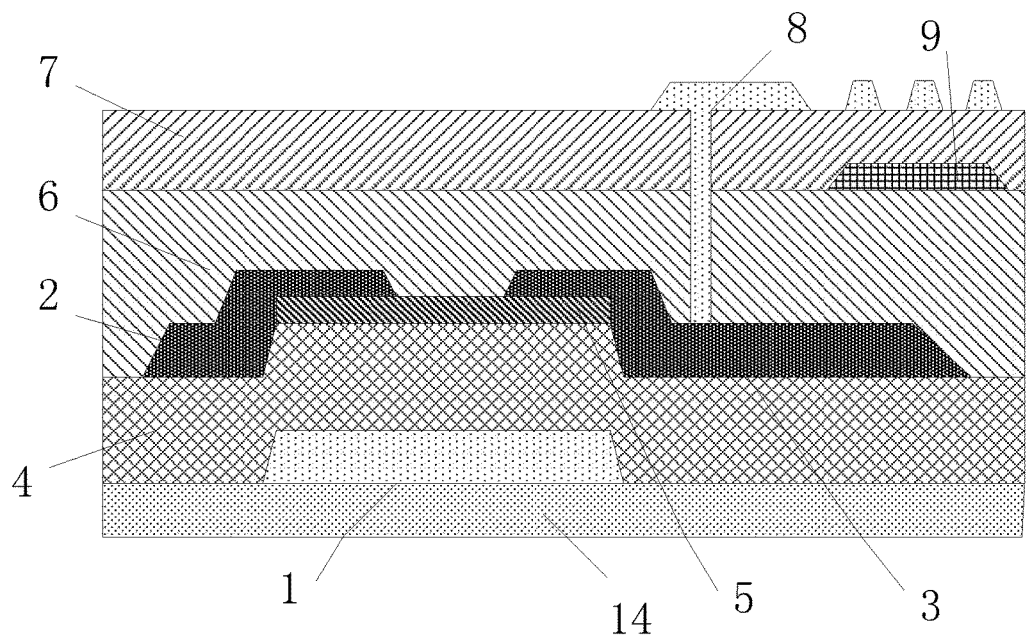
FIG. 5e is a cross-sectional view of an array substrate comprising an oxide thin film transistor provided by an embodiment of the invention.

The first photoresist 11a above the channel region, the second photoresist 11b, and the source-drain metal thin film covering the edge of the first photoresist 11a above the channel region are lifted off, patterns of the source electrode and the drain electrode are formed, and finally the oxide thin film transistor illustrated in FIG. 5e is formed. The first photoresist 11a above the channel region together with those covering the first photoresist 11a are stripped off by the lift-off method, for example.

After the oxide thin film transistor is formed, an array substrate comprising the oxide thin film transistor can be further formed by steps below, as illustrated in FIG. 5e.

A resin layer 6 is formed above the source electrode 2 and the drain electrode 3 by a patterning process, and a common electrode line 9 is formed above the resin layer 6.

Figure 3:
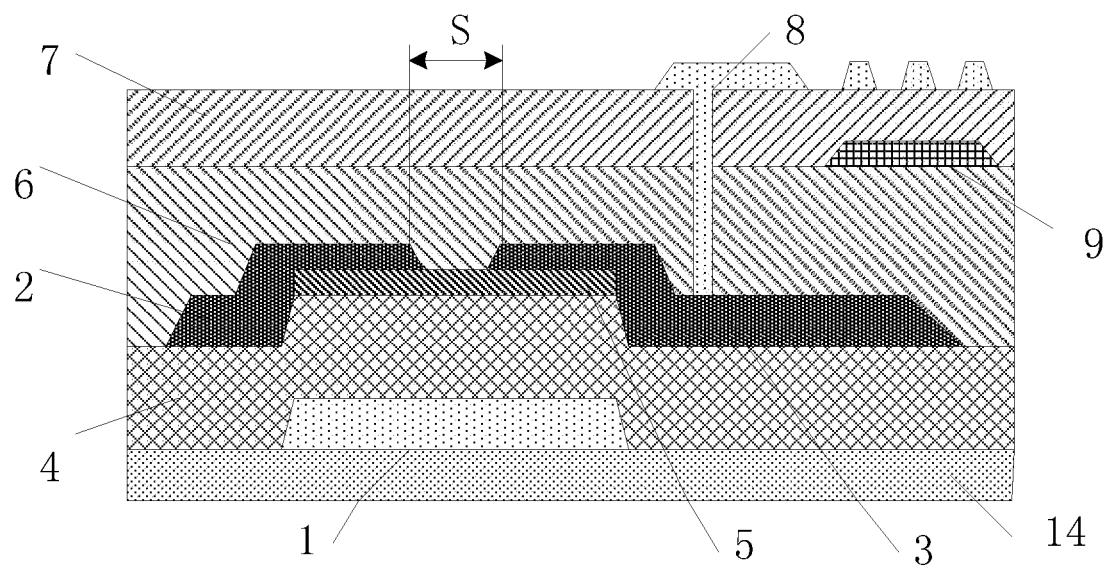
FIG. 3 is a cross-sectional view of an array substrate comprising an oxide thin film transistor provided by an embodiment of the invention.

After the resin layer 6 and the common electrode line 9 are formed, a passivation layer 7 and a pixel electrode 8 are formed, so as to form the array substrate comprising the oxide thin film transistor provided by the embodiment of the invention, as illustrated in FIG. 3.

Figure 4:
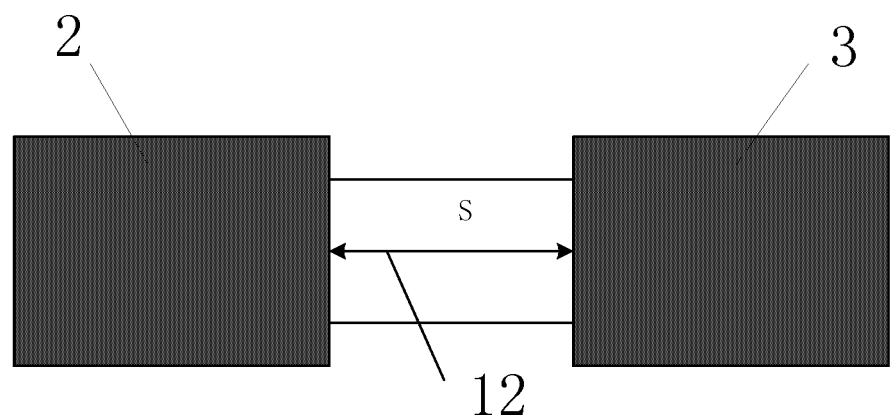
FIG. 4 is a plan view of an oxide thin film transistor provided by an embodiment of the invention.

By using the manufacturing method of oxide thin film transistor provided by the embodiment of the invention, an oxide thin film transistor illustrated in FIG. 4 is obtained and a length S of the channel of the oxide thin film transistor can be accurately up to 5~6 μm. If the accuracy becomes smaller, the oxide thin film transistor with a smaller length of the channel can be obtained.

Figure 2:
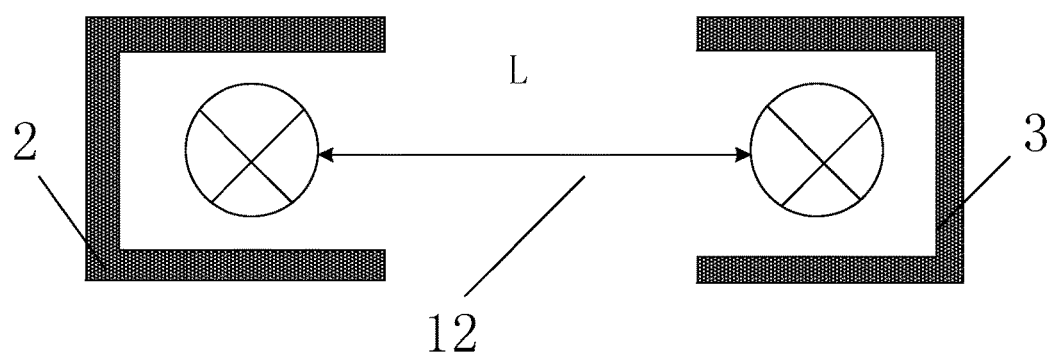
FIG. 2 is a plan view of a semiconductor layer of the oxide thin film transistor illustrated in FIG. 1.

In the above-mentioned lifting-off process, upon the source-drain metal thin film covering the edge of the first photoresist 11a above the channel region is lifted off, it is possible to lift off the source-drain metal thin film more, such that the length S of the channel illustrated in FIG. 4 is in a range of 5 μm to 7 μm after the patterns of the source electrode and the drain electrode are obtained. However, as illustrated in FIG. 2, the known length of the channel of the oxide thin film transistor is between 9.5 μm and 10 μm, or even greater than 10 μm. Accordingly, in the oxide thin film transistor provided by the embodiment of the invention, the photoresist instead of a protective layer is utilized to protect the active layer, and in the last step of manufacturing the oxide thin film transistor, the photoresist is lifted off, such that the source electrode and the drain electrode are directly connected with the active layer, and thus the length of the channel of the oxide thin film transistor is shortened. By reducing of the length of the channel, the thin film transistor can be smaller, thereby improving the aperture ratio in some high PPI products.

Second Embodiment

The embodiment of the invention further provides an oxide thin film transistor, as illustrated in FIG. 3 and FIG. 4. The oxide thin film transistor comprises:

a gate electrode 1 formed on one side of a substrate 14, a gate insulating layer 4 formed on one side of the gate electrode 1 away from the substrate 14, an active layer 5 formed on one side of the gate insulating layer 4 away from the gate electrode 1; and a source electrode 2 and a drain electrode 3 formed on one side of the active layer 5 away from the gate insulating layer 4, wherein the source electrode 2 and the drain electrode 3 are both directly connected with the active layer 5, and the active layer 5 is made of an oxide semiconductor material.

For example, the oxide semiconductor material can be IGZO, IZO, InSnO InGaSnO, etc.

For example, a length S of a channel 12 between the source electrode 2 and the drain electrode 3 is in a range of 5 μm to 6 μm. With the current allowable accuracy, for example, a distance between the source electrode 2 and the drain electrode 3 is 3 μm, and a width w1 of the source electrode 2 located above the first photoresist 11a is in a range of 1 μm to 1.5 μm, and a width w2 of the drain electrode 3 located above the first photoresist 11a is in a range of 1 μm to 1.5 μm.

In the lifting-off process, upon the source-drain metal thin film covering the edge of the first photoresist 11a above the channel region is lifted off, it is possible to lift off the source-drain metal thin film more, such that the length S of the channel 12 between the source electrode 2 and the drain electrode 3 is in a range of 5 μm to 7 μm after the patterns of the source electrode and the drain electrode are obtained.

In the oxide thin film transistor provided by the embodiment of the invention, the source electrode and the drain electrode are formed at both ends of the active layer by a source/drain process to ensure that the source electrode and the drain electrode are directly connected with the active layer, and is not required to be connected with the active layer through via holes, thus shortening the length of the channel of the oxide thin film transistor.

Third Embodiment

The embodiment of the invention further provides an array substrate comprising the oxide thin film transistor in accordance any one of the above embodiments.

The array substrate provided by the embodiment of the invention further comprises: a resin layer 6 and a passivation layer 7, as illustrated in FIG. 3.

The resin layer 6 covers the source electrode 2, the drain electrode 3 and the channel 12.

The passivation layer 7 is located on one side of the resin layer 6 away from the source electrode 2 and the drain electrode 3.

The array substrate provided by the embodiment of the invention further comprises: a pixel electrode 8 located above the passivation layer 7 and connected with the drain electrode 3; and a common electrode line 9 located inside the passivation layer 7 and in close contact with the resin layer 6.

Fourth Embodiment

The embodiment of the invention further provides a display device comprising the array substrate according to any one of the above embodiments. The display device can be a mobile phone, a tablet computer, a television, a display, a notebook computer, a digital photo frame, a navigator and any other products or parts having the display function. The above-mentioned embodiments can be referred to for implementation of the display device, which will not be repeated here.

In the oxide thin film transistor and the manufacturing method thereof, the array substrate and the display device, upon preliminary patterns of the source electrode and the drain electrode are formed, the photoresist instead of a protective layer is used to protect the active layer, and final patterns of the source electrode and the drain electrode are formed by a photoresist lifting-off process, thus shortening the length of the channel of the oxide thin film transistor.

The above embodiments are only illustrative of the invention and not intended to limit the invention. Without departing from the spirit and scope of the invention, the ordinary skilled in the art can also make various changes and modifications. Therefore all equivalent technical solutions are within the scope of the invention, and the scope of the invention is determined by the appended claims.

The present application claims priority of Chinese Patent Application No. 201310542201.X filed on Nov. 5, 2013, the disclosure of which is incorporated herein by reference in its entirety as part of the present application.

What is claimed is:

1. A manufacturing method of an oxide thin film transistor, comprising:

forming a gate electrode and a gate insulating layer sequentially on a substrate;

forming an oxide semiconductor thin film on the gate insulating layer, and forming a first photoresist above an active layer region of the oxide semiconductor thin film, wherein a thickness of a portion of the first photoresist above a channel region is greater than a thickness of a portion of the first photoresist above a non-channel region;

removing a non-active layer region of the oxide semiconductor thin film to form a pattern of an active layer, removing the portion of the first photoresist above the non-channel region, and reserving the portion of the first photoresist above the channel region;

forming a source-drain metal thin film and a second photoresist sequentially on the pattern of the active layer, removing part of a portion of the source-drain metal thin film corresponding to the portion of the first photoresist above the channel region and part of a portion of the second photoresist corresponding to the portion of the first photoresist above the channel region, such that an edge of the portion of the first photoresist above the channel region is covered by a portion of the remaining source-drain metal thin film; and lifting off the remaining second photoresist, removing the portion of the remaining source-drain metal thin film covering the edge of the portion of the first photoresist above the channel region, and lifting off the portion of the first photoresist above the channel region to form patterns of a source electrode and a drain electrode.

2. The method according to claim 1, wherein a photoresist is formed on the oxide semiconductor thin film; a portion of the photoresist above the non-active layer region is fully fully-transparently exposed and developed, a portion of the photoresist above the non-channel region of the active layer region is partially exposed and developed, and a portion of the photoresist above the channel region is non-transparently exposed and developed by half-tone mask to form the first photoresist above the active layer region.

3. The method according to claim 2, wherein the non-active layer region of the oxide semiconductor thin film is removed by a patterning process to obtain the pattern of the active layer; and the portion of the first photoresist above the non-channel region is removed by an ashing process to reserve the portion of the first photoresist above the channel region.

4. The method according to claim 1, wherein a length of a channel in the oxide thin film transistor is in a range of 5 μm to 7 μm.

5. The method according to claim 4, wherein the length of the channel in the oxide thin film transistor is in a range of 5 μm to 6 μm.

6. The method according to claim 2, wherein a length of a channel in the oxide thin film transistor is in a range of 5 μm to 7 μm.

7. The method according to claim 6, wherein the length of the channel in the oxide thin film transistor is in a range of 5 μm to 6 μm.

8. The method according to claim 3, wherein a length of a channel in the oxide thin film transistor is in a range of 5 μm to 7 μm.

9. The method according to claim 8, wherein the length of the channel in the oxide thin film transistor is in a range of 5 μm to 6 μm.

* * * * *